(12) United States Patent
Hur et al.

(10) Patent No.: US 8,409,896 B2
(45) Date of Patent: Apr. 2, 2013

(54) METHOD OF MANUFACTURING SEMICONDUCTOR LIGHT EMITTING DEVICE

(75) Inventors: Won Goo Hur, Incheon (KR); Young Chul Shin, Seoul (KR); Gi Bum Kim, Gyunggi-do (KR); Seung Woo Choi, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/286,834

(22) Filed: Nov. 1, 2011

(65) Prior Publication Data

US 2012/0107987 A1    May 3, 2012

(30) Foreign Application Priority Data

Nov. 1, 2010  (KR) .................. 10-2010-0107738

(51) Int. Cl.
*H01L 21/00* (2006.01)
(52) U.S. Cl. .......................... 438/46; 257/79
(58) Field of Classification Search .............. 438/478, 438/46, 42, 142, 108; 257/79, 45, 46; 977/700
See application file for complete search history.

(56) References Cited

U.S. PATENT DOCUMENTS

| | | | |
|---|---|---|---|
| 5,767,581 A | 6/1998 | Nakamura et al. | |
| 5,961,743 A * | 10/1999 | Yamazaki et al. | 136/258 |
| 6,103,543 A | 8/2000 | Uemura et al. | |
| 6,355,548 B1 * | 3/2002 | Park | 438/591 |
| 7,704,764 B2 * | 4/2010 | Li et al. | 438/29 |
| 8,039,872 B2 * | 10/2011 | Otake | 257/194 |
| 2004/0095977 A1 * | 5/2004 | Nakamura et al. | 372/43 |

FOREIGN PATENT DOCUMENTS

| | | |
|---|---|---|
| EP | 1 047 120 A1 | 10/2000 |
| JP | 2000-307184 | 11/2000 |
| KR | 10-2005-0000691 A | 1/2005 |

OTHER PUBLICATIONS

J. Ross and M. Rubin. Lawrence Berkeley Laboratory University of California. "High Quality GaN Grown by Reactive Sputtering". May 4, 2006. LBL#31726.*
American Physical Society, Journal. Physical Review B. vol. 50, issue 11. pp. 8067-8070 (1994) "Atomic geometry and electronic structure of native defects in GaN". p. 8069, col. 2, first and third paragraph.*

* cited by examiner

*Primary Examiner* — N Drew Richards
*Assistant Examiner* — Christina Sylvia
(74) *Attorney, Agent, or Firm* — McDermott Will & Emery LLP

(57) ABSTRACT

There is provided a method of manufacturing a semiconductor light emitting device, the method including: forming a light emitting structure by sequentially growing an n-type nitride semiconductor layer, an active layer, and a p-type nitride semiconductor layer on a substrate; forming a transparent electrode on the p-type nitride semiconductor layer through a sputtering process; and forming a nitrogen gas atmosphere in an interior of a reaction chamber in which the sputtering process is performed, prior to or during the sputtering process.

In the case of the semiconductor light emitting device obtained according to embodiments of the invention, a deterioration phenomenon in electrode characteristics caused due to a nitrogen vacancy may be minimized in manufacturing a transparent electrode through a sputtering process to thereby allow for the provision of a transparent electrode having significantly improved electrical characteristics.

15 Claims, 5 Drawing Sheets

METHOD OF MANUFACTURING SEMICONDUCTOR LIGHT EMITTING DEVICE

CROSS-REFERENCE TO RELATED APPLICATIONS

This application claims the priority of Korean Patent Application No. 10-2010-0107738 filed on Nov. 1, 2010, in the Korean Intellectual Property Office, the disclosure of which is incorporated herein by reference.

BACKGROUND OF THE INVENTION

1. Field of the Invention

The present invention relates to a method of manufacturing a semiconductor light emitting device.

2. Description of the Related Art

In general, a light emitting diode (LED), a kind of semiconductor light emitting device, is a semiconductor device capable of generating light of various colors due to the recombination of electrons and holes at the junction between a p-type semiconductor and an n-type semiconductor, when current is applied thereto. Demand for this semiconductor light emitting device have been continuously increasing, since the semiconductor light emitting device has various advantages, such as a long lifespan, low power consumption, superior initial driving characteristics, high vibration resistance, and the like, as compared to a filament-based light emitting device. In particular, a group III-nitride semiconductor capable of emitting blue light having a short wavelength has recently come to prominence.

A light emitting device using the group III-nitride semiconductor may be obtained by growing a light emitting structure including n-type and p-type nitride semiconductor layers and an active layer formed therebetween on a substrate. In this case, a transparent electrode may be formed on a surface of the light emitting structure. The transparent electrode may be provided to perform an ohmic contact function or current distribution function between the semiconductor layers and the light emitting structure. The transparent electrode is required to have superior crystallinity in order to have high levels of electrical conductivity and translucency. When crystallinity is deteriorated, device characteristics may be significantly degraded, even in the case of superior light emitting structure quality. Thus, a solution capable of improving the quality of a transparent electrode used in a light emitting device in the related art is required.

SUMMARY OF THE INVENTION

An aspect of the present invention provides a semiconductor light emitting device including a transparent electrode having superior electrical functionality by minimizing a deterioration phenomenon in characteristics thereof.

According to an aspect of the present invention, there is provided a method of manufacturing a semiconductor light emitting device, the method including: forming a light emitting structure by sequentially growing an n-type nitride semiconductor layer, an active layer, and a p-type nitride semiconductor layer on a substrate; forming a transparent electrode on the p-type nitride semiconductor layer through a sputtering process; and forming a nitrogen gas atmosphere in an interior of a reaction chamber in which the sputtering process is performed, prior to or during the sputtering process. The transparent electrode may be made of a transparent conductive oxide.

The transparent electrode may be made of a transparent conductive oxide.

Nitrogen particles are emitted from the p-type nitride semiconductor layer during the sputtering process, such that a nitrogen vacancy is generated in the p-type nitride semiconductor layer. In this case, nitrogen gas in the interior of the reaction chamber fills the nitrogen vacancy.

The transparent electrode may include a part thereof formed in the nitrogen gas atmosphere and another part thereof formed in a state in which a supply of nitrogen gas is interrupted.

In the transparent electrode, after a part thereof may be formed in the nitrogen gas atmosphere, another part thereof may be formed in the state in which a supply of nitrogen gas is interrupted.

After the transparent electrode may entirely cover an upper surface of the p-type nitride semiconductor layer, the supply of nitrogen gas to the interior of the reaction chamber is interrupted.

The p-type nitride semiconductor layer may be formed of p-type GaN.

The method may further include exposing a portion of the n-type nitride semiconductor layer by removing a part of the light emitting structure; forming a first electrode on the n-type nitride semiconductor layer having the exposed portion; and forming a second electrode on the transparent electrode.

The method may further include forming a transparent electrode on the n-type nitride semiconductor layer.

The transparent electrode formed on the n-type nitride semiconductor layer may be formed through a sputtering process. After the sputtering process, an area of the n-type nitride semiconductor layer disposed under the transparent electrode may have a nitrogen vacancy concentration higher than that of other areas thereof.

The method may further include forming an n-type electrode and a p-type electrode on upper portions of the transparent electrodes formed on the n-type and p-type nitride semiconductor layers, respectively.

The n-type and p-type electrodes may be made of a material including aluminum (Al).

The n-type and p-type electrodes may be made of the same material.

The n-type and p-type electrodes may be simultaneously formed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
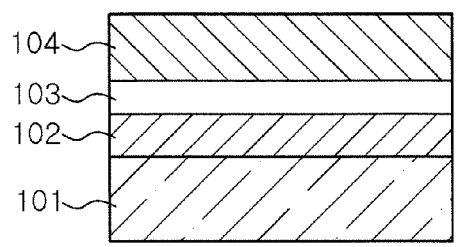
FIGS. 1 through 5 are process cross-sectional views schematically illustrating a method of manufacturing a semiconductor light emitting device according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and sizes of components are exaggerated for clarity. The same or equivalent elements are referred to by the same reference numerals throughout the specification.

Figure 5:
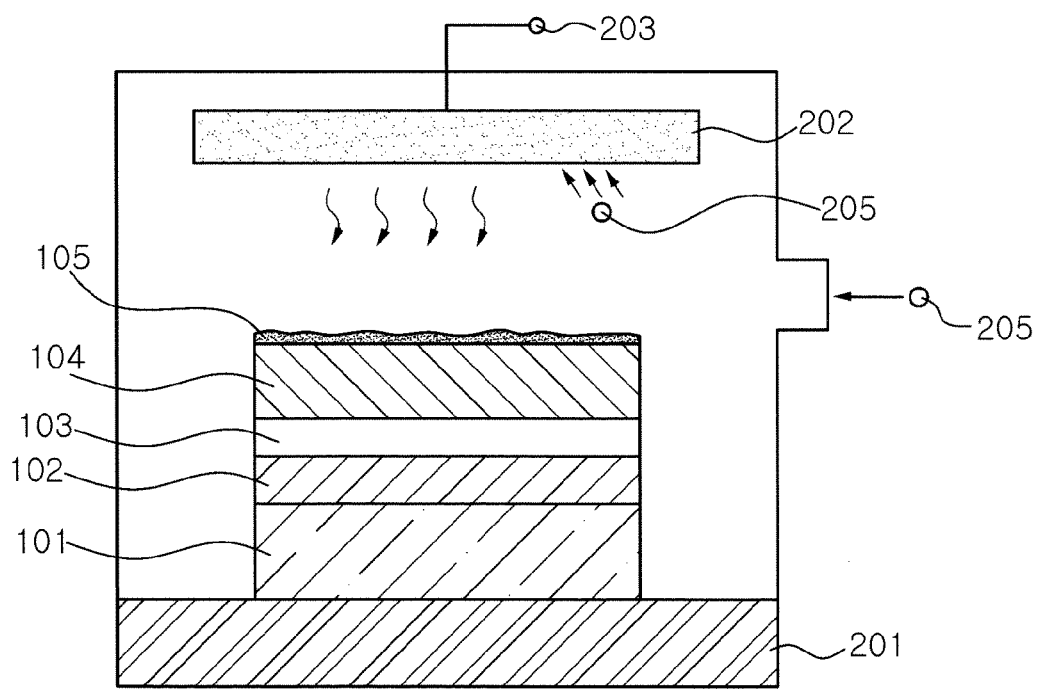
Figure 6:
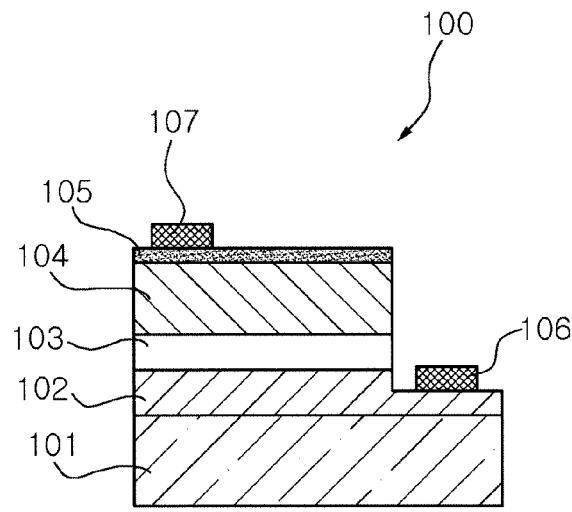
FIG. 6 is a schematic cross-sectional view of a semiconductor light emitting device obtained by the method of manufacturing a semiconductor light emitting device according to the embodiment of the present invention.

FIGS. 1 through 5 are process cross-sectional views schematically illustrating a method of manufacturing a semiconductor light emitting device according to an embodiment of the present invention. FIG. 6 is a schematic cross-sectional view of a semiconductor light emitting device obtained by the method of manufacturing a semiconductor light emitting device according to the embodiment of the present invention. The method of manufacturing a semiconductor light emitting device according to the embodiment of the present invention will be explained as follows. First, as illustrated in FIG. 1, an n-type nitride semiconductor layer 102, an active layer 103, and a p-type nitride semiconductor layer 104 are sequentially formed on a substrate 101. In this case, a structure including the n-type nitride semiconductor layer 102, active layer 103, and p-type nitride semiconductor layer 104 may be referred to as a light emitting structure.

The substrate 101 may be provided as a substrate for growing a semiconductor, and as the substrate 101, a substrate made of an electrically insulative and conductive material, such as sapphire, SiC, $MgAl_2O_4$, MgO, $LiAlO_2$, $LiGaO_2$, GaN, or the like may be used. In this case, the substrate 101 may be made of sapphire having electrical insulating properties, and accordingly, as the substrate 101 having electrical insulating properties is used, an etching process for forming an electrode connected to the n-type nitride semiconductor layer 102 may be involved, to be described later. Sapphire, a crystal having Hexa-Rhombo R3c symmetry, has a lattice constant of 13.001 Å along a c-axis and a lattice constant of 4.758 Å along an a-axis and has a C(0001)-plane, an A(1120)-plane, an R(1102)-plane, or the like. In this case, since the C-plane may be relatively facilitated for the growth of a nitride thin film, and stable at high temperature conditions, the C-plane may be used mainly as a substrate for growing a nitride semiconductor.

The n-type nitride semiconductor layer 102 and the p-type nitride semiconductor layer 104 may be made of a nitride semiconductor doped with n-type impurities and a nitride semiconductor doped with p-type impurities, respectively. For example, each of the n-type and p-type nitride semiconductor layers 102 and 104 may be made of a material having a composition of $Al_xIn_yGa_{(1-x-y)}N$ ($0 \leq x \leq 1$, $0 \leq y \leq 1$, $0 \leq x+y \leq 1$). The active layer 103 formed between the n-type and p-type nitride semiconductor layers 102 and 104 may emit light having a predetermined energy level due to a recombination of electrons and holes, and have a multiple quantum well (MQW) structure having an alternately stacked quantum well layer and quantum barrier layer, for example, a structure of InGaN/GaN. The n-type and p-type nitride semiconductor layers 102 and 104, and active layer 103 configuring the light emitting structure may be grown through a process well-known in the related art, such as metal organic chemical vapor deposition (MOCVD), hydride vapor phase epitaxy (HVPE), molecular beam epitaxy (MBE), or the like.

Figure 2:
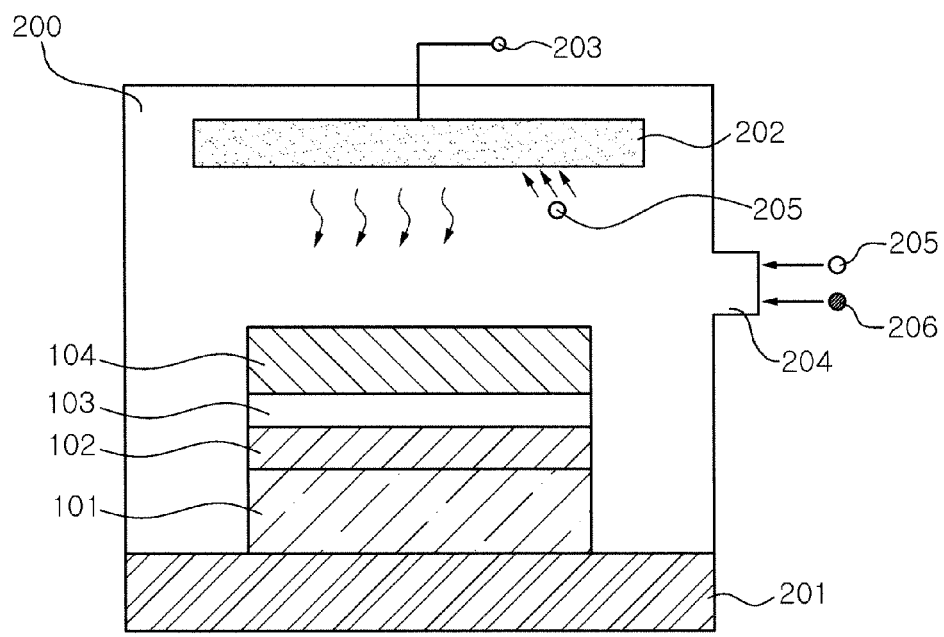

Next, a transparent electrode may be formed on the p-type nitride semiconductor layer 104, and a sputtering process may be used, as illustrated in FIG. 2. Sputtering refers to a method of fabricating a thin film by colliding a particle having a high energy level with a target made of a material the same as that of a desired thin film, and separating atoms and molecules therefrom. Specifically in explaining sputtering with reference to the embodiment of the present invention, the substrate 101 having light emitting structures 102, 103, and 104 formed thereon is disposed on a support 201 within a sputtering reaction chamber 200, and then a sputtering gas 205 is introduced to the sputtering reaction chamber 20. As the sputtering gas 205, argon (Ar) gas known as a sputtering gas in the related art may be used. The sputtering gas 205 introduced to the sputtering reaction chamber 200 through a gas introduction unit 204 may be ionized due to voltage applied to the sputtering reaction chamber 200, to thereby have a plasma state in which electrons, ions (for example, $Ar^+$ ions), and neutral gas are mixed. To this end, a sputtering target 202 may be electrically charged by a power supply unit 203 connected thereto, so as to be a negative terminal. In this case, although not separately illustrated, a positive terminal connected to another power supply unit may be present within the sputtering reaction chamber 200, and for example, the support 201 may act as a positive terminal.

Figure 3:
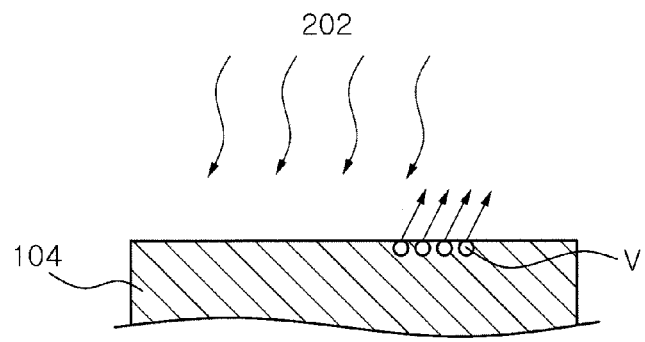
Figure 4:
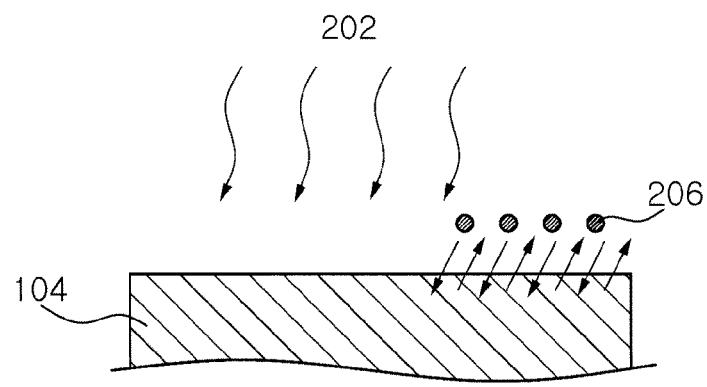

The ionized sputtering gas 205 may collide with the sputtering target 202 due to voltage applied to the sputtering reaction chamber 200, and accordingly, a sputtered material from the sputtering target 202 may form a thin film on the p-type nitride semiconductor layer 104. In the embodiment of the present invention, the sputtering target 202 may be a material for forming a transparent electrode, and as the material for forming a transparent electrode, a transparent conductive oxide, for example, ITO, CIO, ZnO, or the like may be used. The sputtering process may have advantages, in that equipment stability may be relatively high as compared to the case of using an electron bean deposition process, maintenance aspects may be advantageous, and a thickness and components of a thin film may be easily controlled. However, a transparent electrode fabricated through the sputtering process may show deteriorated electrical characteristics thereof, that is, ohmic characteristics, as compared to the case of using the electron bean deposition process. This may be understood because a nitrogen vacancy v may be generated in the p-type nitride semiconductor layer 104, due to the sputtering target 202, as illustrated in FIG. 3

Specifically, particles sputtered from the sputtering target 202 through the sputtering gas 205 may collide with the p-type nitride semiconductor layer 104 to thereby cause damage to the p-type nitride semiconductor layer 104. Accordingly, a material constituting the p-type nitride semiconductor layer 104 may be separated to the outside. When the p-type nitride semiconductor layer 104 is formed of p-type GaN, nitrogen (N) particles having a particle size smaller than that of gallium particles may be more easily separated to the outside. By the separated nitrogen (N) particles, the nitrogen vacancy v may be generated in the p-type nitride semiconductor layer 104, and accordingly, the amount of free electrons may be increased. Consequently, the increased free electrons may be offset with holes present in the p-type nitride semiconductor layer 104, such that the amount of carriers may be reduced. The generation of the nitrogen vacancy v may be a factor leading to degradation in electrical characteristics of the p-type nitride semiconductor layer 104.

In order to minimize such a defect, in the embodiment of the present invention, nitrogen gas 206, as well as the sputtering gas 205 may be introduced to the sputtering reaction chamber 200, to thereby allow the interior of the sputtering reaction chamber 200 to have a nitrogen gas atmosphere. The introduction of the nitrogen gas 206 may be performed before or during the sputtering process, and may be carried out as long as a condition, in which the interior of the sputtering reaction chamber 200 maintains a nitrogen gas atmosphere in the forming of the transparent electrode, is satisfied. The nitrogen gas 206 introduced to the sputtering reaction chamber 200 may fill the nitrogen vacancy v generated through the sputtering process, to thereby prevent electrical characteristics of the p-type nitride semiconductor layer 104 from being deteriorated.

Meanwhile, the introduction of the nitrogen gas 206 may be performed throughout the sputtering process; however, in some cases, the introduction of the nitrogen gas 206 may be performed during a portion of the sputtering process. That is, in the case of the initial sputtering process, the p-type nitride semiconductor layer 104 is exposed, such that the introduction of the nitrogen gas 206 may be required. However, when the p-type nitride semiconductor layer 104 is not exposed due to the formation of a transparent electrode 105, as illustrated in FIG. 5, the supplying of the nitrogen gas 206 may be interrupted and only the sputtering gas 205 may be introduced. In this manner, a more efficient process may be obtained.

Next, as illustrated in FIG. 6, first and second electrodes 106 and 107 for applying an electrical signal to a semiconductor light emitting device may be formed, and accordingly, a semiconductor light emitting device 100 may be obtained. The embodiment of the present invention describes a method of forming the first electrode 106 on a surface of the n-type nitride semiconductor layer 102 exposed by removing a part of the light emitting structures 102, 103, and 104 and transparent electrode 105 after the formation of the transparent electrode 105, and forming the second electrode 107 on the transparent electrode 105; however, the order of the process may be modified. That is, prior to the formation of the transparent electrode 105, the n-type nitride semiconductor layer 102 may be exposed by removing a part of the light emitting structures 102, 103, and 104, the transparent electrode 105 may be formed, and then the first and second electrodes 106 and 107 may be formed.

Figure 7:
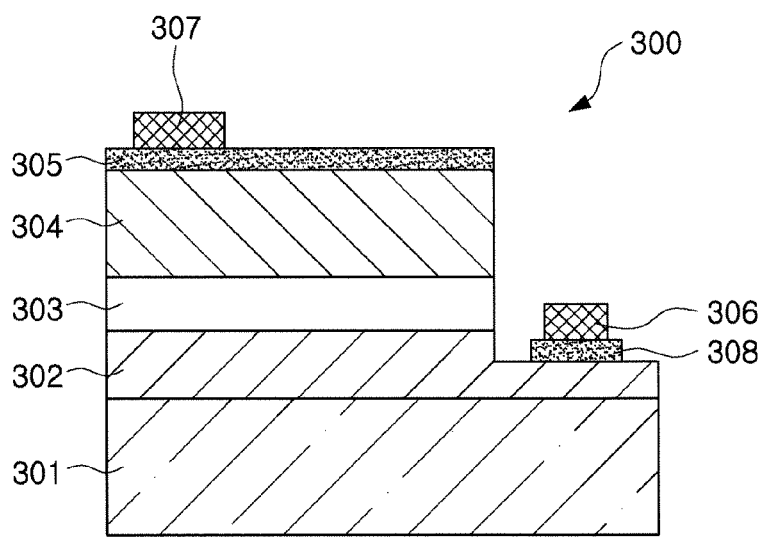
FIG. 7 is a schematic cross-sectional view of a semiconductor light emitting device manufactured according to another embodiment of the present invention.
Figure 8:
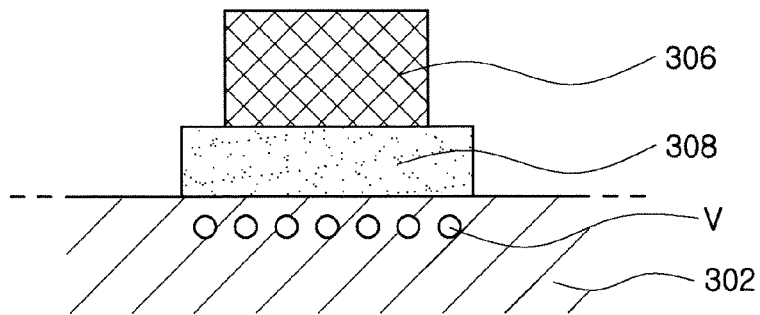
FIG. 8 is an enlarged view of an n-type nitride semiconductor layer and n-type electrode circumferential areas from FIG. 7.

FIG. 7 is a schematic cross-sectional view of a semiconductor light emitting device manufactured according to another embodiment of the present invention. FIG. 8 is an enlarged view of an n-type nitride semiconductor layer and n-type electrode circumferential areas from FIG. 7. Referring to FIG. 7, a semiconductor light emitting device 300 may include a substrate 301, an n-type nitride semiconductor layer 302, an active layer 303, a p-type nitride semiconductor layer 304, transparent electrodes 305 and 308, and n-type and p-type electrodes 306 and 307. In this case, the transparent electrodes 305 and 308 may represent an n-type transparent electrode (indicated by reference numeral 308) and a p-type transparent electrode (indicated by reference numeral 305). Unlike the foregoing embodiment, the n-type transparent electrode 308 may be disposed between the n-type nitride semiconductor layer 302 and the n-type electrode 306, and may be made of a transparent conductive oxide the same as that of the p-type transparent electrode 305. In addition, the n-type transparent electrode 308 may also be formed through the sputtering process, and accordingly, electrical characteristics of the semiconductor light emitting device may be improved.

Specifically, similar to the case of the foregoing explanation, a part of particles constituting the n-type nitride semiconductor layer 302 may be separated from the n-type nitride semiconductor layer 302 through the sputtering process, due to re-sputtering effects. In this case, a relatively great of nitrogen (N) particles having a relatively small ion size may be separated. Accordingly, as illustrated in FIG. 8, since the nitrogen vacancy v may be generated in the n-type nitride semiconductor layer 302, an area of the n-type nitride semiconductor layer 302 disposed under the n-type transparent electrode 308 may have a concentration of the nitrogen vacancy v, higher than that of the other area thereof, to thereby cause an increase in the amount of free electrons, whereby resistance in the surface of the n-type nitride semiconductor layer 302 may be reduced.

Meanwhile, each of the n-type and p-type electrodes 306 and 307 respectively formed on the n-type and p-type transparent electrodes 308 and 305 may be made of a material including aluminum (Al), instead of a generally used gold (Au) electrode, and accordingly, processing costs may be reduced. In addition, in the formation of an Al electrode, the n-type and p-type electrodes 306 and 307 may be simultaneously formed through a single process, and defects in the exteriors of the n-type and p-type electrodes 306 and 307 may be minimized. This will be explained with reference to FIGS. 9 through 12.

Figure 9:
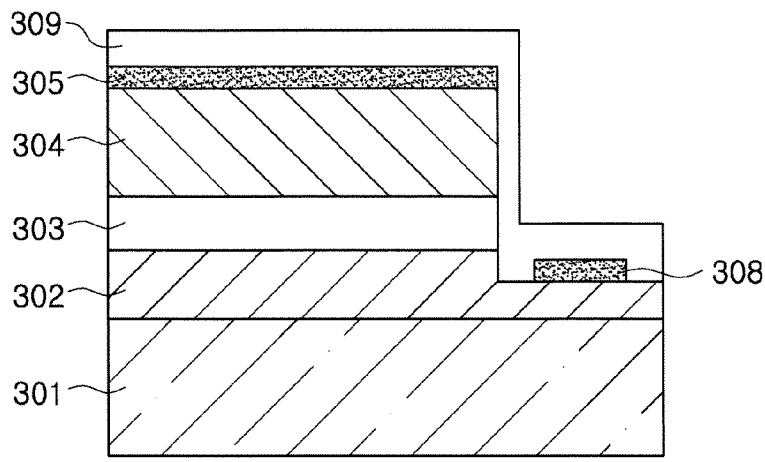
FIGS. 9 through 12 are process cross-sectional views explaining an example of a method of manufacturing the semiconductor light emitting device of FIG. 7.
Figure 10:
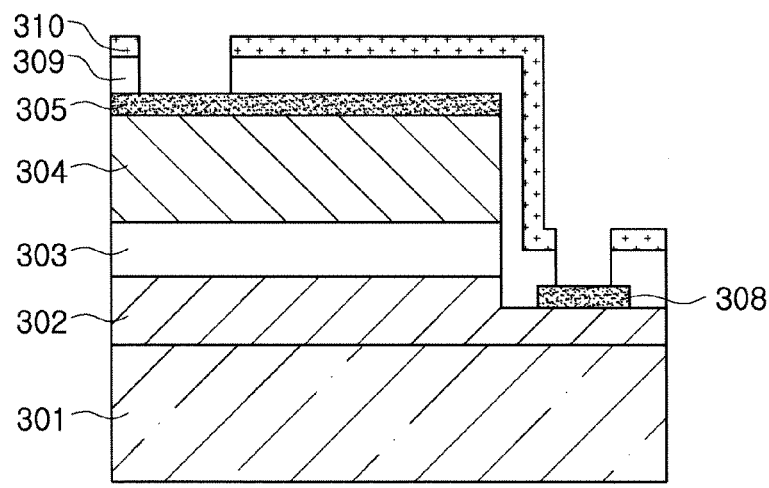
Figure 11:
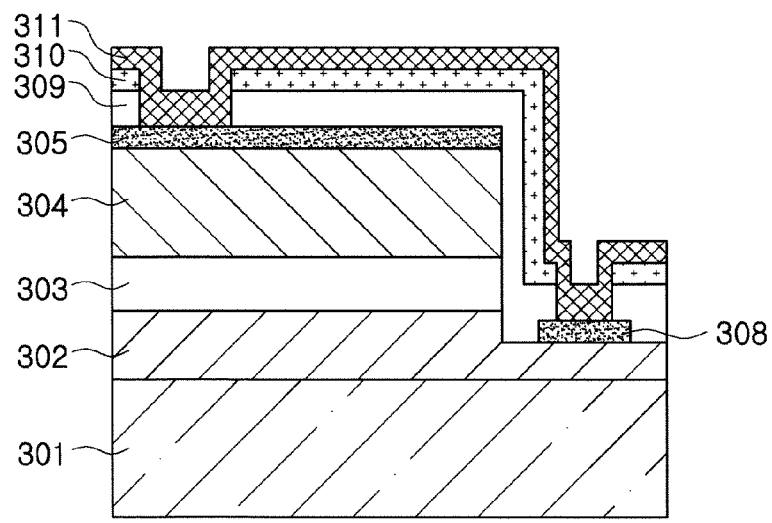

FIGS. 9 through 12 are process cross-sectional views explaining an example of a method of manufacturing the semiconductor light emitting device of FIG. 7. As illustrated in FIG. 9, in the state of forming the n-type and p-type transparent electrodes 308 and 305, an insulating part 309 may be formed thereon. The insulating part 309 may be made of a dielectric substance, such as a silicon oxide, a silicon nitride, or the like and may function to passivate a final semiconductor light emitting device. Next, as illustrated in FIG. 10, the transparent electrodes 305 and 308 are exposed by removing a part of the insulating part 309 using a mask 10. The transparent electrodes 305 and 308 are exposed so as to form n-type and p-type electrodes. Subsequently, as illustrated in FIG. 11, an electrode material layer 311 including Al may be formed, and the electrode material layer 311 may be formed to cover up to the mask 310, with the exception of the open area of the insulating part 309. In this manner, in the embodiment of the present invention, the n-type and p-type electrodes may be simultaneously formed in such a manner that they are made of the same material, for example, a material including Al, such that process convenience may be improved.

Figure 12:
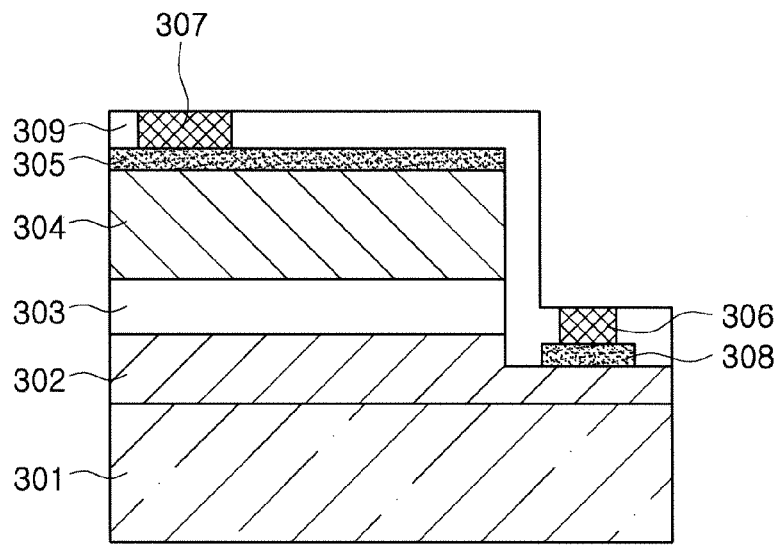

Next, as illustrated in FIG. 12, the mask 310 is lifted off, such that the electrode material layer 311 may be removed, other than portions corresponding to the n-type and p-type electrodes 306 and 307. In the embodiment of the present invention, the n-type and p-type electrodes 306 and 307 may be made of a material including Al, as mentioned above, and a process of forming an insulating layer again after the formation of the n-type and p-type electrodes 306 and 307 or a process of etching the insulating layer so as to remove a part of the insulating layer may not required, to thereby allow for minimal damage to the n-type and p-type electrodes 306 and 307. Therefore, a relatively inexpensive Al electrode may be realized while defects in the exterior of the electrode may be minimized.

Figure 13:
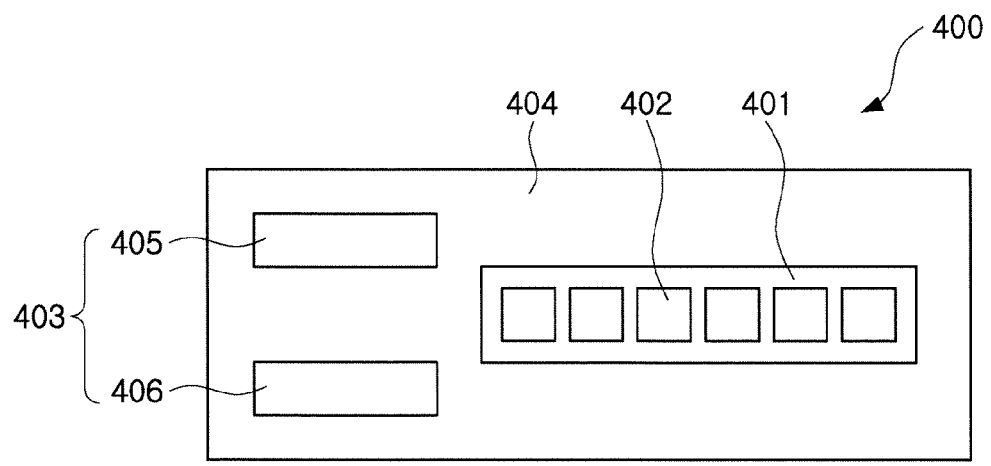
FIG. 13 is a configuration view schematically illustrating an example of the use of the semiconductor light emitting device according to the present invention.

Meanwhile, the semiconductor light emitting device manufactured through the process may be used in various fields. FIG. 13 is a configuration view schematically illustrating an example of the use of the semiconductor light emitting device according to the present invention. Referring to FIG. 13, a lighting apparatus 400 may include alight emitting module 401, a structure 404 having the light emitting module 401 disposed therein, and a power supply unit 403. In the light emitting module 401, at least one semiconductor light emitting device 402 obtained by the method according to the present invention may be disposed. In this case, the semiconductor light emitting device 402 may be mounted in the light emitting module 401 as it is, or may be provided in package form. The power supply unit 403 may include an interface 405 receiving power and a power control unit 406 controlling power supplied to the light emitting module 401. In this case, the interface 405 may include a fuse blocking overcurrent and an electromagnetic wave shielding filter shielding an electromagnetic wave interference signal.

The power control unit 406 may include a rectifying unit converting an alternate current into a direct current, and a constant voltage control unit converting the alternate current into an appropriate voltage, when an alternate current power source is inputted thereto as a power source. When the power source is a direct current source having a voltage appropriate for the light emitting module 401 (for example, a battery), the rectifying unit and the constant voltage control unit may be omitted. In addition, when the light emitting module 401 employs a device, such as an alternate current-LED (AC-LED), the alternate current power source may be directly supplied to the light emitting module 401. Also in this case, the rectifying unit or the constant voltage control unit may be omitted. Further, the power control unit 406 may control color temperature or the like, to thereby allow for a display of lighting according to human sensibility. In addition, the power supply unit 403 may include a feedback circuit device performing comparison between the amount of luminescence from the semiconductor light emitting device 402 and a preset amount of luminescence, and a memory device having information stored therein, such as a desired brightness or color rendering properties.

The lighting apparatus 400 may be used in a backlight unit used in a display device, for example, a liquid crystal display device including an image panel, an indoor lighting apparatus such as a lamp, flat panel lighting or the like, or an outdoor lighting apparatus such as a street lamp, a sign, a notice sign or the like. In addition, the lighting apparatus 400 may be used in a lighting device for various means of transportation, for example, automobiles, ships, air craft or the like. Further, the lighting apparatus 400 may be used in home appliances such as a television (TV), a refrigerator or the like, medical equipment, or the like.

As set forth above, in the semiconductor light emitting device obtained according to embodiments of the invention, a deterioration phenomenon in electrode characteristics caused due to a nitrogen vacancy may be minimized in manufacturing a transparent electrode through a sputtering process to thereby allow for the provision of a transparent electrode having significantly improved electrical characteristics. As a relatively inexpensive Al electrode may be used, defects in the exterior of the electrode may be minimized while allowing for a simplified manufacturing process. Further, an electrode structure having superior electrical characteristics may be obtained.

While the present invention has been shown and described in connection with the embodiments, it will be apparent to those skilled in the art that modifications and variations can be made without departing from the spirit and scope of the invention as defined by the appended claims.

What is claimed is:

1. A method of manufacturing a semiconductor light emitting device, the method comprising:
  forming a light emitting structure by sequentially growing an n-type nitride semiconductor layer, an active layer, and a p-type nitride semiconductor layer on a substrate;
  forming a transparent electrode on the p-type nitride semiconductor layer through a sputtering process; and
  forming a nitrogen gas atmosphere in an interior of a reaction chamber in which the sputtering process is performed, prior to or during the sputtering process,
  wherein the transparent electrode includes a first part thereof formed in the nitrogen gas atmosphere and a second part thereof formed in a state in which a supply of nitrogen gas is interrupted.

2. The method of claim 1, wherein the transparent electrode is made of a transparent conductive oxide.

3. The method of claim 1, wherein nitrogen particles are emitted from the p-type nitride semiconductor layer during the sputtering process, such that a nitrogen vacancy is generated in the p-type nitride semiconductor layer.

4. The method of claim 3, wherein nitrogen gas in the interior of the reaction chamber fills the nitrogen vacancy.

5. The method of claim 1, wherein in the transparent electrode, after the first part thereof is formed in the nitrogen gas atmosphere, the second part thereof is formed in the state in which a supply of nitrogen gas is interrupted.

6. The method of claim 5, wherein after the transparent electrode entirely covers an upper surface of the p-type nitride semiconductor layer, the supply of nitrogen gas to the interior of the reaction chamber is interrupted.

7. The method of claim 1, wherein the p-type nitride semiconductor layer is formed of p-type GaN.

8. The method of claim 1, further comprising:
  exposing a portion of the n-type nitride semiconductor layer by removing a part of the light emitting structure;
  forming a first electrode on the n-type nitride semiconductor layer having the exposed portion; and
  forming a second electrode on the transparent electrode.

9. The method of claim 1, further comprising:
  forming a transparent electrode on the n-type nitride semiconductor layer.

10. The method of claim 9, wherein the transparent electrode formed on the n-type nitride semiconductor layer is formed through a sputtering process.

11. The method of claim 10, wherein after the sputtering process, an area of the n-type nitride semiconductor layer disposed under the transparent electrode has a nitrogen vacancy concentration higher than that of other areas thereof.

12. The method of claim 9, further comprising forming an n-type electrode and a p-type electrode on upper portions of the transparent electrodes formed on the n-type and p-type nitride semiconductor layers, respectively.

13. The method of claim 12, wherein the n-type and p-type electrodes are made of a material including aluminum (Al).

14. The method of claim 12, wherein the n-type and p-type electrodes are made of the same material.

15. The method of claim 12, wherein the n-type and p-type electrodes are simultaneously formed.

* * * * *